(12) United States Patent
Chen

(10) Patent No.: US 11,975,507 B2
(45) Date of Patent: May 7, 2024

(54) THERMOSETTING RESIN COMPOSITION, PREPREG CONTAINING SAME, METAL FOIL-CLAD LAMINATE AND PRINTED CIRCUIT BOARD

(71) Applicant: Shengyi Technology Co., Ltd., Guangdong (CN)

(72) Inventor: Zhenwen Chen, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 236 days.

(21) Appl. No.: 17/417,901

(22) PCT Filed: Mar. 6, 2019

(86) PCT No.: PCT/CN2019/077162
§ 371 (c)(1),
(2) Date: Jun. 24, 2021

(87) PCT Pub. No.: WO2020/155291
PCT Pub. Date: Aug. 6, 2020

(65) Prior Publication Data
US 2022/0056225 A1 Feb. 24, 2022

(30) Foreign Application Priority Data
Jan. 30, 2019 (CN) .......................... 201910090656.X

(51) Int. Cl.
| | |
|---|---|
| C08J 5/24 | (2006.01) |
| B32B 15/092 | (2006.01) |
| C08L 45/00 | (2006.01) |
| C08L 63/00 | (2006.01) |
| C08L 79/04 | (2006.01) |
| H05K 1/03 | (2006.01) |
| H05K 1/05 | (2006.01) |

(52) U.S. Cl.
CPC ............ *B32B 15/092* (2013.01); *C08J 5/244* (2021.05); *C08J 5/249* (2021.05); *C08L 45/00* (2013.01); *C08L 63/00* (2013.01); *C08L 79/04* (2013.01); *H05K 1/0366* (2013.01); *H05K 1/056* (2013.01); *B32B 2457/08* (2013.01); *C08J 2345/00* (2013.01); *C08J 2363/00* (2013.01); *C08J 2379/04* (2013.01); *C08L 2201/02* (2013.01); *C08L 2205/03* (2013.01)

(58) Field of Classification Search
CPC .... B32B 15/092; B32B 2457/08; C08J 5/244; C08J 5/249; C08J 2345/00; C08J 2363/00; C08J 2379/04; C08L 45/00; C08L 63/00; C08L 79/04; C08L 2201/02; C08L 2205/03; H05K 1/0366; H05K 1/056
See application file for complete search history.

(56) References Cited

U.S. PATENT DOCUMENTS

| | | | |
|---|---|---|---|
| 2016/0237278 A1* | 8/2016 | Yang | ........................ B32B 15/20 |
| 2018/0371243 A1 | 12/2018 | Hu et al. | |

FOREIGN PATENT DOCUMENTS

| | | | | |
|---|---|---|---|---|
| CN | 103834168 A | 6/2014 | | |
| CN | 104725781 A | 6/2015 | | |
| CN | 104845363 A | 8/2015 | | |
| CN | 104974520 A | 10/2015 | | |
| CN | 106496936 A | 3/2017 | | |
| CN | 106749952 A | 5/2017 | | |
| CN | 107245239 A | * 10/2017 | ............. | B32B 15/08 |
| CN | 107245239 A | 10/2017 | | |
| CN | 107459650 A | 12/2017 | | |
| CN | 108047647 A | 5/2018 | | |
| CN | 109233244 A | 1/2019 | | |
| CN | 109265654 A | 1/2019 | | |
| EP | 3037475 A1 | 6/2016 | | |
| JP | 2016088972 A | 5/2016 | | |
| JP | 2018172519 A | * 11/2018 | | |
| WO | 2020045408 A1 | 3/2020 | | |

OTHER PUBLICATIONS

Machine Translation of CN 107245239 A (Year: 2017).*
Machine Translation of Endo JP 2018172519 A (Year: 2018).*
Office Action issued in corresponding Chinese Patent Application No. 201910090656.X on Nov. 13, 2020.
Search Report issued in corresponding Chinese Patent Application No. 201910090656.X on Nov. 13, 2020.
International Search Report issued in PCT/CN2019/077162 on Oct. 22, 2019.
Office Action issued on Jun. 24, 2022 by the JPO in the corresponding Patent Application No. 2021-537036, with English translation.
Office Action issued on Jan. 27, 2023 by the KIPO in the corresponding Patent Application No. 10-2021-7024539, with English translation.

* cited by examiner

*Primary Examiner* — Callie E Shosho
*Assistant Examiner* — Bethany M Miller
(74) *Attorney, Agent, or Firm* — Norton Rose Fulbright US LLP; James R. Crawford

(57) ABSTRACT

The thermosetting resin composition, a prepreg containing same, a metal foil-clad laminate and a printed circuit board; the resin composition comprises the following components: a combination of a bismaleimide resin and a benzoxazine resin or a prepolymer of a bismaleimide resin and a benzoxazine resin, an epoxy resin and an active ester. A metal foil-clad laminate prepared by using the resin composition provided by the present invention has a high glass transition temperature, a low thermal expansion coefficient, a high high-temperature modulus, a high peel strength, a low dielectric constant, a low dielectric loss factor, as well as good heat resistance and good processability.

17 Claims, No Drawings

THERMOSETTING RESIN COMPOSITION, PREPREG CONTAINING SAME, METAL FOIL-CLAD LAMINATE AND PRINTED CIRCUIT BOARD

CROSS REFERENCE TO RELATED APPLICATIONS

This application is a national phase under 35 U.S.C. § 371 of International Application No. PCT/CN2019/077162 filed on Mar. 6, 2019, which claims the benefit of priority from Chinese Patent Application No. 201910090656.X filed on Jan. 30, 2019. The entire contents of these applications are incorporated herein by reference in their entirety.

TECHNICAL FIELD

The present invention belongs to the technical field of copper clad laminates, and relates to a thermosetting resin composition, a prepreg, a metal foil-clad laminate and a printed circuit board containing the same.

BACKGROUND ART

With the high-speed and multi-functionalization development of information processing of electronic products, the application frequency continues to increase and lower dielectric constant (Dk) and dielectric loss value (Df) are required. Therefore, it has become a hot spot for the substrate industry to reduce Dk/Df. In order to achieve low Dk and low Df, various low-polarity resins such as styrene-maleic anhydride oligomer (SMA) are widely used. SMA can impart excellent dielectric properties and heat resistance to the substrate, but there are problems such as high water absorption and large coefficient of thermal expansion (CTE).

At present, although general copper clad laminates can achieve low Dk and low Df, or higher Tg and lower CTE, there are rare copper clad laminates in the current industry which can simultaneously meet high Tg and low CTE, low Dk and low Df, and HDI and even packaging applications. Although the emergence and application of substrate-like PCB-type copper clad laminates are developing rapidly, the Tg, CTE, modulus, and even Dk/Df of this type of substrate-like PCB need to be further improved to meet the demand of the development of the electronic industry for performance improvement of the material of the copper clad laminates.

CN104725781A discloses a resin composition, as well as a prepreg and a laminate using the same. The resin composition comprises 15-55% of an amine-modified bismaleimide (BMI), 10-45% of a benzoxazine resin and 0-75% of an epoxy resin, based on the weight percentages of each component. Although the dielectric properties and heat resistance of the copper clad laminate are improved, there is still much room for improvement in the properties such as Tg, dielectric constant, and dielectric loss of the composition.

CN104845363 discloses a halogen-free resin composition and a use thereof. Based on the weight parts of organic solids, the halogen-free resin composition comprises (A) 40-80 parts by weight of an allyl-modified benzoxazine resin, (B) 10-20 parts by weight of a hydrocarbon resin, (C) 10-40 parts by weight of an allyl-modified polyphenylene ether resin, (D) 10-20 parts by weight of an allyl-modified bismaleimide resin, (E) 0.01-3 parts by weight of an initiator, (F) 10-100 parts by weight of a filler and (G) 0-80 parts by weight of a phosphorus-containing flame retardant. The laminates finally obtained according to the invention have lower Dk and Df, and better flame retardant effect. Because some components need to be self-made, there is a higher cost and a complicated preparation method. Moreover, there is still room for further improvement in the glass transition temperature Tg and CTE of the finally-obtained laminate. CN107459650A discloses a modified bismaleimide resin prepolymer and a preparation method therefor. It discloses a melting process which uses an allyl compound, aminophenylacetylene, and benzoxazine for copolymerization, chain extension, and toughening modification of bismaleimide. The obtained modified bismaleimide resin prepolymer has high heat resistance, but the dielectric properties and dielectric loss properties of the material are not considered in the modification process.

Therefore, it is an urgent problem to be solved in the field to develop a new composition that can ensure that the finally-prepared copper clad laminate has a lower dielectric constant, a lower dielectric loss factor and a lower coefficient of thermal expansion while having a higher glass transition temperature.

CONTENTS OF THE INVENTION

The object of the present invention is to provide a thermosetting resin composition, a prepreg, a metal foil-clad laminate and a printed circuit board containing the same. The metal foil-clad laminate prepared by using the resin composition provided by the present invention has a high glass transition temperature, a low coefficient of thermal expansion, a higher high-temperature modulus, a high peel strength, a low dielectric constant, a low dielectric loss factor, good heat resistance and good processability.

In order to achieve such object, the present invention adopts the following technical solutions.

In the first aspect, the present invention provides a thermosetting resin composition comprising the following components: a combination of a bismaleimide resin and a benzoxazine resin, or a prepolymer of a bismaleimide resin and a benzoxazine resin, an epoxy resin and an active ester.

In the present invention, a combination of a bismaleimide resin and a benzoxazine resin, or a prepolymer of a bismaleimide resin and a benzoxazine resin, and an active ester are added to a cured resin together. The addition of the bismaleimide resin significantly increases the glass transition temperature of the resin composition system, while the addition of the benzoxazine resin can improve the heat resistance and electrical properties of the resin composition. At the same time, the addition of the active ester into the resin composition can neutralize the shortcomings of increased dielectric properties of the system due to the addition of the bismaleimide and benzoxazine resins. The addition of the active ester can reduce the dielectric properties of the resin composition, especially the dielectric loss factor. Therefore, the combined action of the three components makes the finally-obtained resin composition have a high glass transition temperature, high heat resistance, a low dielectric constant and a low dielectric loss factor.

Meanwhile, the addition of a certain amount of epoxy resin in the present invention can balance other performance deficiencies caused by the bismaleimide resin, the benzoxazine resin and the active ester, and can increase the adhesiveness of the resin composition to a certain extent.

Preferably, the monomer of the bismaleimide resin has a structure represented by Formula I:

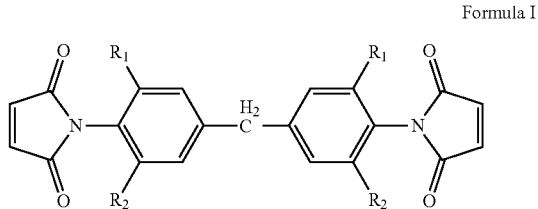

Formula I wherein $R_1$ is a substituted or unsubstituted C1-C4 alkyl group; $R_2$ is an alkyl group of C3 or more.

Preferably, $R_1$ is a substituted or unsubstituted C3-C4 alkyl group.

C1-C4 alkyl group may be methyl, ethyl, propyl, isopropyl, n-butyl, and isobutyl, etc.

An alkyl group of C3 or more may be propyl, isopropyl, n-butyl, and isobutyl, etc.

In the present invention, the bismaleimide resin with the above structure is selected. The increased ratio of C and H, and decreased spatial compactness can further reduce the dielectric constant and dielectric loss factor of the finally-obtained resin composition.

Preferably, the resin composition further includes a phosphorus-containing flame retardant.

Preferably, the resin composition comprises, in parts by weight, the following components:
a bismaleimide resin 15-50 parts by weight;
a benzoxazine resin 15-30 parts by weight;
an epoxy resin 15-30 parts by weight;
an active ester 2-20 parts by weight;
a phosphorous-containing flame retardant 0-10 parts by weight; or
a prepolymer of a bismaleimide resin and a benzoxazine resin 30-80 parts by weight,
an epoxy resin 15-30 parts by weight;
an active ester 2-20 parts by weight;
a phosphorous-containing flame retardant 0-10 parts by weight.

Preferably, the resin composition comprises a prepolymer of a bismaleimide resin and a benzoxazine resin, an epoxy resin, an active ester and a phosphorous-containing flame retardant.

When a prepolymer of a bismaleimide resin and a benzoxazine resin is selected as the additive component in the present invention, the finally-obtained resin composition has a lower coefficient of thermal expansion and better sizing processability.

In the present invention, the bismaleimide resin is present in an amount of 15-50 parts by weight, e.g., 20, 25, 30, 35, 40, 45 parts by weight, etc.

In the present invention, the prepolymer of a bismaleimide resin and a benzoxazine resin is present in an amount of 30-80 parts by weight, such as 35, 40, 45, 50, 55, 60, 65, 70, 75 parts by weight, etc.

In the present invention, the benzoxazine resin is present in an amount of 15-30 parts by weight, e.g., 18, 20, 22, 24, 26, 28 parts by weight, etc.

Preferably, the benzoxazine resin is any one selected from the group consisting of an allyl-containing benzoxazine resin, a bisphenol A-type benzoxazine resin, a bisphenol F-type benzoxazine resin, a diamine-type benzoxazine resin, a phenolphthalein-type benzoxazine resin, a dicyclopentadiene-type benzoxazine resin, a bisphenol fluorene-type benzoxazine resin, and a combination of at least two selected therefrom, preferably an allyl-containing benzoxazine resin.

In the present invention, a benzoxazine resin with allyl groups is selected as an additive component, which can further improve the toughness and dielectric properties of the finally-obtained copper clad laminate or laminate, and is more conducive to controlling the process during processing.

In the present invention, the epoxy resin is present in an amount of 15-30 parts by weight, e.g., 18, 20, 22, 24, 26 and 28 parts by weight, etc.

Preferably, the epoxy resin is a halogen-free and phosphorus-free epoxy resin, which is any one selected from the group consisting of a biphenyl epoxy resin, a naphthol-type epoxy resin, a phenolic epoxy resin, a dicyclopentadiene-type epoxy resin, an aralkyl epoxy resin, a multifunctional epoxy resin, and a mixture of at least two selected therefrom, preferably any one selected from the group consisting of a biphenyl epoxy resin, a dicyclopentadiene-type epoxy resin, a naphthol-type epoxy resin, and a combination of at least two selected therefrom, further preferably a biphenyl epoxy resin.

In the present invention, the active ester is present in an amount of 2-20 parts by weight, e.g., 4, 8, 10, 12, 15, 16 and 18 parts by weight, etc.

Preferably, the active ester includes an active ester having a structure as shown in Formula II and/or an active ester having a structure as shown in Formula III:

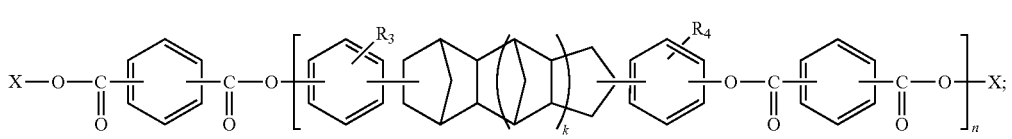

Formula II wherein X is a phenyl group or a naphthyl group; $R_3$ and $R_4$ are each independently selected from a hydrogen atom or a methyl group; k is 0 or 1; and n has an average value of 0.2-2, e.g. 0.3, 0.5, 0.7, 0.8, 0.9, 1.0, 1.2, 1.5, 1.8, etc.;

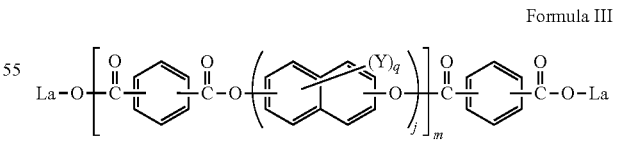

Formula III wherein La is a phenyl group or a naphthyl group; Y in $(Y)_q$ is selected from a methyl group, a hydrogen atom and an ester group; q is 1, 2 or 3; j is an integer of 1-10, e.g., 2, 3, 4, 5, 6, 7, 8 or 9; m is an integer of 1-10, e.g., 2, 3, 4, 5, 6, 7, 8 or 9.

In the present invention, the phosphorus-containing flame retardant is present in an amount of 0-10 parts by weight, e.g., 1, 2, 3, 4, 5, 6, 7, 8 or 9 parts by weight.

Preferably, the phosphorus-containing flame retardant is any one selected from the group consisting of tris(2,6-dimethylphenyl)phosphine, 10-(2,5-dihydroxyphenyl)-9,10-dihydro-9-oxa-10-phosphinophenanthrene-10-oxide, 2,6-bis(2,6-dimethylphenyl)-phosphinobenzene, 10-phenyl-9,10-dihydro-9-oxa-10-phosphinophenanthrene-10-oxide, phosphazene, and a combination of at least two selected therefrom.

Preferably, the resin composition further comprises 0.01-1 part by weight of a curing accelerator, e.g., 0.02, 0.05, 0.1, 0.5 or 0.8 part by weight, etc.

Preferably, the curing accelerator is any one selected from the group consisting of imidazoles, 4-dimethylaminopyridine, triphenylphosphine, boron trifluoride monoethylamine, zinc octoate, and a combination of at least two selected therefrom.

Preferably, the resin composition further comprises 5 to 300 parts by weight of a filler, e.g., 10, 15, 20, 50, 80, 100, 150, 180, 250 or 280 parts by weight, etc.

Preferably, the filler has a median particle size of 0.01-50 μm, e.g., 0.02, 0.05, 0.15, 0.2, 0.5, 0.8, 1, 1.5, 2, 5, 8, 10, 15, 25, 30, 40 or 45 μm, etc., more preferably 0.01-20 μm, further preferably 0.1-10 μm.

Preferably, the filler is selected from an organic filler and an inorganic filler, further preferably an inorganic filler, more preferably a surface-treated inorganic filler, most preferably a surface-treated silica.

Preferably, a surface treatment agent for surface treatment is any one selected from the group consisting of a silane coupling agent, an organosilicon oligomer, a titanate coupling agent, and a combination of at least two selected therefrom.

Preferably, the surface treatment agent is present in an amount of 0.1-5.0 parts by weight, e.g., 0.2, 0.5, 0.8, 1.0, 1.2, 1.5, 2.0, 2.5, 3.5, 4 or 4.5 parts by weight, more preferably 0.5-3.0 parts by weight, and more preferably 0.75-2.0 parts by weight, based on 100 parts by weight of the inorganic filler.

Preferably, the inorganic filler is any one selected from the group consisting of non-metal oxides, metal nitrides, non-metal nitrides, inorganic hydrates, inorganic salts, and a combination of at least two selected therefrom, further preferably any one selected from the group consisting of fused silica, crystalline silica, spherical silica, hollow silica, aluminum hydroxide, aluminum oxide, talc, aluminum nitride, boron nitride, silicon carbide, barium sulfate, barium titanate, strontium titanate, boehmite, calcium carbonate, calcium silicate, mica, and a combination of at least two selected therefrom.

Preferably, the organic filler is any one selected from the group consisting of polytetrafluoroethylene, polyphenylene sulfide, polyethersulfone, and a combination of at least two selected therefrom.

The expression "comprising/comprise(s)" in the present invention means that, in addition to the aforementioned components, there may also include other components which impart different characteristics to the resin composition. In addition, the expression "comprising/comprise(s)" mentioned in the present invention may also be replaced with a closed expression "being/is(are)" or "consisting/consist(s) of".

For example, the resin composition may further comprise various additives. Specific examples include coupling agents, antioxidants, heat stabilizers, antistatic agents, ultra-violet absorbers, pigments, colorants, or lubricants. These various additives may be used alone or in combination.

In the second aspect, the present invention provides a resin varnish obtained by dissolving or dispersing the thermosetting resin composition in the first aspect in a solvent.

In the third aspect, the present invention provides a prepreg comprising a reinforcing material and the thermosetting resin composition in the first aspect attached to the reinforcing material after impregnation and drying.

In the fourth aspect, the present invention provides a laminate comprising one or at least two laminated prepregs in the third aspect.

In the fifth aspect, the present invention provides a metal foil-clad laminate comprising one or at least two laminated prepregs in the third aspect and metal foil(s) covered on one or both sides of the outer side of the prepreg(s).

In the sixth aspect, the present invention provides a printed circuit board comprising at least one prepreg in the third aspect.

As compared with the prior art, the present invention has the following beneficial effects.

(1) In the present invention, a combination of a bismaleimide resin and a benzoxazine resin or a prepolymer of a bismaleimide resin and a benzoxazine resin and an active ester are added to a cured resin together. The addition of the bismaleimide resin significantly increases the glass transition temperature of the resin composition system, while the addition of the benzoxazine resin can improve the heat resistance and electrical properties of the resin composition. At the same time, the addition of the active ester into the resin composition can neutralize the shortcomings of increased dielectric properties of the system due to the addition of the bismaleimide and benzoxazine resins. The addition of the active ester can reduce the dielectric properties of the resin composition, especially the dielectric loss factor. Therefore, the combined action of the three components makes the finally-obtained resin composition have a high glass transition temperature, high heat resistance, a low dielectric constant and a low dielectric loss factor.

(2) When a prepolymer of a bismaleimide resin and a benzoxazine resin is selected as the additive component in the present invention, the finally-obtained resin composition has a lower coefficient of thermal expansion and better sizing processability.

(3) The copper clad laminate prepared from the resin composition provided by the present invention has a high glass transition temperature, a low coefficient of thermal expansion, a higher high-temperature modulus, a high peel strength, a low dielectric constant, a low dielectric loss factor, good heat resistance and good processability. The glass transition temperature can reach 230° C. or higher; the lowest coefficient of thermal expansion can reach 1.8%; the lowest dielectric constant (1 GHz) can reach 3.81; and the lowest dielectric loss (1 GHz) can reach 0.0045.

EMBODIMENTS

The technical solution of the present invention will be further explained through examples below. Those skilled in the art shall know that the examples are merely to help understand the present invention, and should not be regarded as specific limitations to the present invention.

The materials and brand information involved in the following examples and comparative examples are as follows:

(A) Bismaleimide resin
  A-1: 3,3'-dimethyl-4,4'-diamino-5,5'-diisopropyldiphenylmethane bismaleimide, D937, EM Technology, having a specific structure as follows,

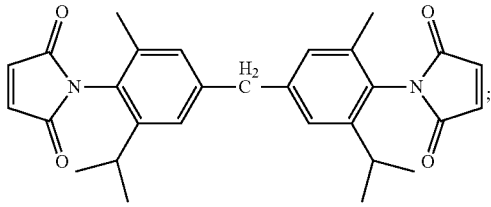 [SMILES: Cc1cc(Cc2cc(C)c(N3C(=O)C=CC3=O)c(C(C)C)c2)cc(C(C)C)c1N1C(=O)C=CC1=O]

A-2: 4,4'-diamino-3,3',5,5'-tetraisopropyldiphenylmethane bismaleimide, EM Technology, having a specific structure as follows,

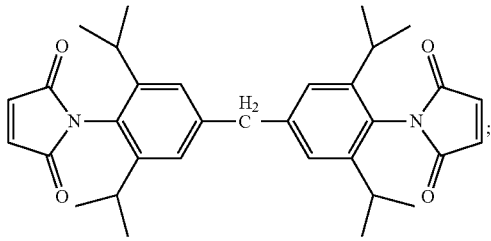 [SMILES: CC(C)c1cc(Cc2cc(C(C)C)c(N3C(=O)C=CC3=O)c(C(C)C)c2)cc(C(C)C)c1N1C(=O)C=CC1=O]

A-3: 2,2'-bis[4-(4-maleimidophenoxy)phenyl]propane, BMI-80, KI Chemical, Japan, having a specific structure as follows,

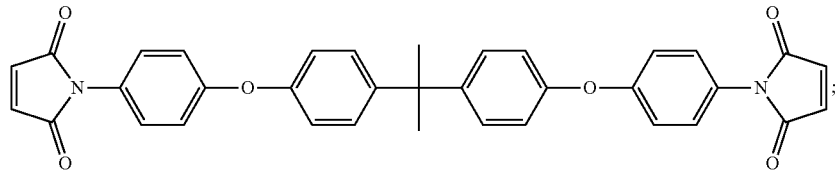 [SMILES: CC(C)(c1ccc(Oc2ccc(N3C(=O)C=CC3=O)cc2)cc1)c1ccc(Oc2ccc(N3C(=O)C=CC3=O)cc2)cc1]
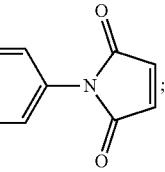

A-4: diphenylmethane-type bismaleimide, BMI-01, Hubei Province Honghu Bismaleimide Resin Factory, having a specific structure as follows,

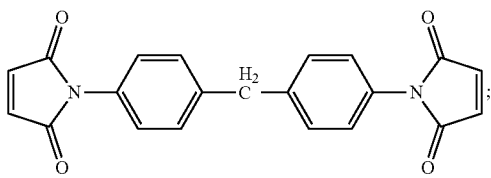 [SMILES: O=C1C=CC(=O)N1c1ccc(Cc2ccc(N3C(=O)C=CC3=O)cc2)cc1]

(B) Benzoxazine resin
  B-1: Allyl-containing benzoxazine resin, D148, EM Technology;
  B-2: Allyl-containing benzoxazine resin, 5031, Kolon;
  B-3: Non-allyl benzoxazine, DCPD-type benzoxazine resin 8260, Huntsman;
(C) Epoxy resin
  C-1: DCPD-type epoxy resin, HP-7200H, DIC, Japan;
  C-2: Biphenyl-type epoxy resin, NC-3000L, Nippon Kayaku;
  C-3: Naphthalene-containing epoxy resin, NC-7300L, Nippon Kayaku;
(D) Active ester
  D-1: DCPD-type active ester, 8000, DIC, Japan;
  D-2: DCPD modified active ester, 8000L, DIC, Japan;
  D-3: Naphthalene-containing active ester, 8150, DIC, Japan;
(E) Phosphorus-containing flame retardant
  E-1: allyl-containing phosphazene, SPV-100, Otsuka Chemical, Japan;
  E-2: Additive phosphorus-containing flame retardant, OP930, Clariant, Germany;
  E-3: Phosphorus-containing phenolic aldehyde, XZ-92741, Olin, USA;
(F) Curing accelerator: dimethylimidazole, 2-MI, Shikoku Chemicals, Japan;
(G) Filler
  G-1: Spherical silica, SC2050, Admateches, Japan;
  G-2: Angular silica, 525, Sibelco.

Examples 1-4

The thermosetting resin composition was prepared according to the components shown in Table 1 (the amounts of raw materials were in parts by weight), and the metal foil-clad laminate sample was prepared according to the following production method for laminates.
  (1) Reacting the bismaleimide resin and the benzoxazine resin in a DMF solution at 130-160° C. for 0.5-8 h to obtain a prepolymer of the bismaleimide resin and the benzoxazine resin, then adding other components and evenly mixing to obtain a resin varnish;
  (2) Infiltrating 2116 electronic-grade glass fiber cloth with the resin varnish, baking off the solvent and baking to a semi-cured state to obtain a prepreg having a suitable resin content, then stacking a certain amount of prepregs, placing a piece of electrolytic copper foil dedicated for copper clad laminate on top and bottom, respectively, curing and laminating with a high temperature press at 220° C./90 min to obtain a copper clad laminate.

Examples 5-10

The thermosetting resin composition was prepared according to the components shown in Table 1 (the amounts of raw materials were in parts by weight), and the copper clad laminate sample was prepared according to the following production method for laminates.
  (1) Evenly mixing the bismaleimide resin, benzoxazine resin, epoxy resin and active ester in a formula amount in a DMF solution to obtain a resin varnish;
  (2) Infiltrating 2116 electronic-grade glass fiber cloth with the resin varnish, baking off the solvent and baking to a semi-cured state to obtain a prepreg having a suitable resin content, then stacking a certain amount of prepregs, placing a piece of electrolytic copper foil dedicated for copper clad laminate on top and bottom, respectively, curing and laminating with a high temperature press at 220° C./90 min to obtain a copper clad laminate.

Comparative Examples 1-14

The thermosetting resin composition was prepared according to the components shown in Table 2 and Table 3 (the amounts of each raw material were in parts by weight), and the copper clad laminate sample was prepared according to the production method for laminates in Examples 5-10.

TABLE 1

| Samples | Example 1 | Example 2 | Example 3 | Example 4 | Example 5 | Example 6 | Example 7 | Example 8 | Example 9 | Example 10 |
|---|---|---|---|---|---|---|---|---|---|---|
| A-1 | 17 | | | | | | | | | |
| A-2 | | 20 | 50 | 17 | 20 | 50 | 15 | 20 | | |
| A-3 | | | | | | | | | | 20 |
| A-4 | | | | | | | | | 20 | |
| B-1 | 17 | 20 | | 17 | 20 | | | | 20 | |
| B-2 | | | 30 | | | 30 | 15 | | | |
| B-3 | | | | | | | | 20 | | 20 |
| C-1 | 16 | | | 16 | | | 30 | | | |
| C-2 | | 16 | | | 16 | | | 16 | 16 | 16 |
| C-3 | | | 15 | | | 15 | | | | |
| D-1 | 6 | | | 6 | | | 20 | | | |
| D-2 | | 10 | | | 10 | | | 10 | 10 | 10 |
| D-3 | | | 2 | | | 2 | | | | |
| E-1 | 4 | | | 4 | | | 1 | | | |
| E-2 | | 6 | | | 6 | | | 6 | 6 | 6 |
| E-3 | | | 1 | | | 1 | | | | |
| F | 0.05 | 0.05 | 0.05 | 0.05 | 0.05 | 0.05 | 1 | 0.05 | 0.05 | 0.05 |
| G-1 | 40 | | 2 | 40 | | 2 | 19 | | | |
| G-2 | | 28 | | | 28 | | | 28 | 28 | 28 |

TABLE 2

| Samples | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| A-1 | | | | | 33.3 | | |
| A-2 | 50 | | | 25 | | | |
| A-3 | | | | | | | 10 |
| A-4 | | | | | | | |
| B-1 | | 50 | | 25 | | 33.3 | |
| B-2 | | | | | | | 15 |
| B-3 | | | | | | | |
| C-1 | | | | | | | 30 |
| C-2 | 16 | 16 | 16 | 16 | 16 | 16 | |
| C-3 | | | | | | | |
| D-1 | | | | | | | 20 |
| D-2 | | | 50 | | 16.7 | 16.7 | |
| D-3 | | | | | | | |
| E-1 | | | | | | | 1 |
| E-2 | 6 | 6 | 6 | 6 | 6 | 6 | |
| E-3 | | | | | | | |
| F | 0.05 | 0.05 | 0.05 | 0.05 | 0.05 | 0.05 | 1 |
| G-1 | | | | | | | 24 |
| G-2 | 28 | 28 | 28 | 28 | 28 | 28 | |

TABLE 3

| Samples | Comparative Example 8 | Comparative Example 9 | Comparative Example 10 | Comparative Example 11 | Comparative Example 12 | Comparative Example 13 | Comparative Example 14 |
|---|---|---|---|---|---|---|---|
| A-1 | | | | | | | |
| A-2 | 52 | | 50 | 20 | | 50 | |
| A-3 | | 15 | | | 15 | | 15 |
| A-4 | | | | | | | |
| B-1 | | | | 20 | | | |
| B-2 | 30 | 10 | 32 | | 15 | 30 | 15 |
| B-3 | | | | | | | |
| C-1 | | 30 | | | 35 | | 30 |
| C-2 | | | | 10 | | | |
| C-3 | 15 | | 15 | | | 15 | |
| D-1 | | 20 | | | 20 | | 25 |
| D-2 | | | | 10 | | | |
| D-3 | 2 | | 2 | | | 0 | |

TABLE 3-continued

| Samples | Comparative Example 8 | Comparative Example 9 | Comparative Example 10 | Comparative Example 11 | Comparative Example 12 | Comparative Example 13 | Comparative Example 14 |
|---|---|---|---|---|---|---|---|
| E-1 |  | 1 |  |  | 1 |  | 1 |
| E-2 |  |  |  | 6 |  |  |  |
| E-3 | 1 |  | 1 |  |  | 1 |  |
| F | 0.05 | 0.05 | 0.05 | 0.05 | 0.05 | 0.05 | 0.05 |
| G-1 |  | 24 |  |  | 14 | 4 | 14 |
| G-2 |  |  |  | 34 |  |  |  |

Performance Tests

Performance tests were carried out for the copper clad laminates provided in Examples 1-10 and Comparative Examples 1-14. The test methods are as follows.

(1) Glass transition temperature ($T_g$): measured by using a DMA test according to the DMA test method specified in IPC-TM-650 2.4.24;
(2) Modulus: measured by using a DMA test according to the DMA test method specified in IPC-TM-650 2.4.24;
(3) Coefficient of thermal expansion (CTE): measured in accordance with the CTE test method specified in IPC-TM-650 2.4.24 C;
(4) Dielectric constant (Dk) and dielectric loss factor (Df): the dielectric constant and dielectric loss factor at 1 GHz were measured according to IPC-TM-650 2.5.5.9 using a plate capacitor method;
(5) Anti-peel strength: measured according to the test method for anti-peel strength specified in IPC-TM-650 2.4.8;
(6) Thermal cracking resistance time (T-288): measured by using a TMA instrument in accordance with the T-288 test method specified in IPC-TM-650 2.4.24.1;
(7) PCT: in accordance with the IPC standard method, under the test conditions of 105 KPa/60 min, 288° C. limit;
(8) 2116 sizing process: observing the appearance of the prepreg, sampling and weighing to obtain the weight per unit area, and comparing and evaluating whether the appearance and unit weight of the prepreg is easy to control, wherein Excellent: The unit weight being within the standard±4 g/m$^2$; the appearance being flat and smooth; and no visible defects;

General: The unit weight being within the standard±4 g/m$^2$, the appearance being relatively flat; no visible defects;

Poor: The unit weight being not within the standard±4 g/m$^2$; visible defects such as sagging or bubbles.

Tables 4-7 show the test results of the laminates provided in Examples 1-8 and Comparative Examples 1-14.

TABLE 4

| Items | Example 1 | Example 2 | Example 3 | Example 4 | Example 5 | Example 6 |
|---|---|---|---|---|---|---|
| $T_g$(° C.) | 230 | 230 | 237 | 231 | 231 | 232 |
| Modulus (50° C./260° C., GPa) | 19/8 | 18/5 | 17/1 | 19/8 | 18/5 | 17/1 |
| Z-CTE(%) | 1.8 | 2.6 | 3.6 | 1.8 | 2.6 | 3.5 |
| Dk(1 GHz) | 3.95 | 3.90 | 3.81 | 3.90 | 3.95 | 3.86 |
| Df(1 GHz) | 0.0048 | 0.0058 | 0.0086 | 0.0045 | 0.0062 | 0.0090 |
| PS(1/2 OZ, N/mm) | 0.95 | 1.05 | 0.98 | 0.94 | 0.97 | 0.92 |
| T-288° C.(min) | >30 | >30 | >30 | >30 | 30 | 29 |
| PCT(1 h) | pass | pass | pass | pass | pass | pass |
| 2116 sizing process | Excellent | Excellent | Excellent | Excellent | General | General |

TABLE 5

| Items | Example 7 | Example 8 | Example 9 | Example 10 | Comparative Example 1 | Comparative Example 2 |
|---|---|---|---|---|---|---|
| $T_g$(° C.) | 195 | 225 | 208 | 180 | 170 | 168 |
| Modulus (50° C./260° C., GPa) | 17/2 | 18/5 | 18/6 | 17/0.2 | 13/0.1 | 16/0.3 |
| Z-CTE(%) | 3.2 | 2.6 | 2.6 | 3.6 | 2.9 | 2.8 |
| Dk(1 GHz) | 3.85 | 4.08 | 4.15 | 4.0 | 3.95 | 4.15 |
| Df(1 GHz) | 0.0050 | 0.0060 | 0.0075 | 0.0085 | 0.0045 | 0.0095 |
| PS(1/2 OZ, N/mm) | 0.95 | 0.93 | 0.98 | 1.00 | 0.3 | 1.0 |
| T-288° C.(min) | 20 | 28 | 25 | 16 | 2 | 30 |
| PCT(1 h) | pass | pass | failed | failed | failed | pass |
| 2116 sizing process | General | General | General | General | Poor | General |

TABLE 6

| Items | Comparative Example 3 | Comparative Example 4 | Comparative Example 5 | Comparative Example 6 | Comparative Example 7 | Comparative Example 8 |
|---|---|---|---|---|---|---|
| $T_g$(° C.) | 170 | 225 | 176 | 170 | 180 | 240 |
| Modulus (50° C./260° C., GPa) | 17/0.2 | 18/5 | 13/0.6 | 16/0.3 | 16/0.6 | 16/0.5 |
| Z-CTE(%) | 2.8 | 2.5 | 2.9 | 2.8 | 3.0 | 3.6 |
| Dk(1 GHz) | 4.1 | 4.1 | 4.1 | 4.05 | 3.98 | 3.8 |
| Df(1 GHz) | 0.0086 | 0.0092 | 0.0055 | 0.0065 | 0.0072 | 0.0100 |
| PS(1/2 OZ, N/mm) | 0.72 | 0.98 | 0.5 | 0.85 | 0.93 | 0.98 |
| T-288° C.(min) | 18 | 30 | 5 | 28 | 30 | 9 |
| PCT(1 h) | pass | pass | failed | pass | pass | failed |
| 2116 sizing process | General | General | Poor | General | General | General |

TABLE 7

| Items | Comparative Example 9 | Comparative Example 10 | Comparative Example 11 | Comparative Example 12 | Comparative Example 13 | Comparative Example 14 |
|---|---|---|---|---|---|---|
| $T_g$(° C.) | 174 | 230 | 220 | 168 | 236 | 167 |
| Modulus (50° C./260° C., GPa) | 16/0.3 | 16/0.3 | 16/1.5 | 16/0.4 | 17/1 | 16/0.3 |
| Z-CTE(%) | 2.9 | 3.6 | 2.9 | 3.1 | 3.6 | 3.1 |
| Dk(1 GHz) | 3.95 | 3.81 | 3.96 | 3.88 | 3.85 | 3.87 |
| Df(1 GHz) | 0.009 | 0.0099 | 0.0091 | 0.009 | 0.0098 | 0.0088 |
| PS(1/2 OZ, N/mm) | 1.05 | 0.99 | 0.98 | 0.94 | 0.95 | 0.93 |
| T-288° C.(min) | 16 | 8 | 26 | 15 | 23 | 13 |
| PCT(1 h) | pass | failed | failed | failed | failed | failed |
| 2116 sizing process | General | General | General | General | General | General |

It can be seen from the examples and performance tests that the copper clad laminate prepared by the resin composition in the present invention has a high glass transition temperature, a low coefficient of thermal expansion, a higher high-temperature modulus, a relatively higher peel strength, and a relatively lower dielectric constant and dielectric loss factor, as well as good heat resistance and good processability. The glass transition temperature may reach 230° C. or higher; the lowest coefficient of thermal expansion may reach 1.8%; the lowest dielectric constant (1 GHz) may reach 3.81; and the lowest dielectric loss (1 GHz) may reach 0.0045.

It can be seen from the comparison between Example 1 and Example 4 that, when $R_1$ in the structure of Formula I is a substituted or unsubstituted C3-C4 alkyl group, the finally-obtained copper clad laminate has a higher glass transition temperature and may achieve relatively lower dielectric constant and dielectric loss factor.

In Example 2, the resin composition was prepared by firstly forming a prepolymer by using the bismaleimide resin and the benzoxazine resin, and then mixing with other components to prepare a prepreg. In Example 5, the bismaleimide resin and the benzoxazine resin were directly mixed with other components. From the comparison between Examples 2 and 5, it can be seen that the prepolymer of a bismaleimide resin and a benzoxazine resin in the present invention can make the finally-obtained copper clad laminate have a lower coefficient of thermal expansion and better sizing process.

From the comparison between Example 2 and Examples 8-10, it can be seen that the present invention discloses preferably using a bismaleimide resin having the structure of Formula I in conjunction with an allyl-containing benzoxazine resin. At this time, the finally-obtained copper clad laminate has better overall performance.

From the comparison between Example 5 and Comparative Examples 1-6, it can be seen that the combined action and synergistic interaction of the bismaleimide resin, benzoxazine resin and active ester in the present invention make the finally-obtained copper clad laminate have a high glass transition temperature, a low dielectric constant and a low dielectric loss factor, and other excellent properties. All three components are indispensable.

From the comparison between Examples 5-7 and Comparative Examples 7-14, it can be seen that the addition amounts of the bismaleimide resin, benzoxazine resin, epoxy resin and active ester in the present invention need to be within the ranges defined in the present invention. Above or below the ranges, the beneficial effects of the present invention cannot be obtained.

The applicant declares that the present invention discloses the above-mentioned examples to illustrate the thermosetting resin composition, prepreg, metal foil-clad laminate and printed circuit board containing the same of the present invention. The present invention, however, is not limited to the above detailed methods. That is to say, it does not mean that the present invention must rely on the above detailed methods to be implemented. Those skilled in the art should understand that any improvement to the present invention, equivalent replacement of each raw material in the product of the present invention, addition of auxiliary components, selection of specific methods, etc., all fall within the protection and disclosure scope of the present invention.

The invention claimed is:

1. A thermosetting resin composition, comprising the following components:
   a combination of a bismaleimide resin and a benzoxazine resin, an epoxy resin and an active ester;
   wherein a monomer of the bismaleimide resin has a structure shown in Formula I:

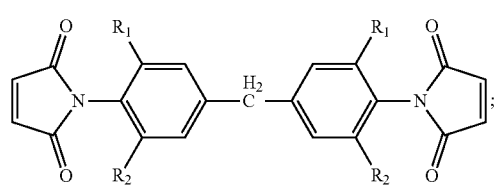

Formula I wherein $R_1$ is a substituted or unsubstituted C3-C4 alkyl group; R2 is an alkyl group C3 or more;
   the active ester comprises an active ester having a structure as shown in Formula III:

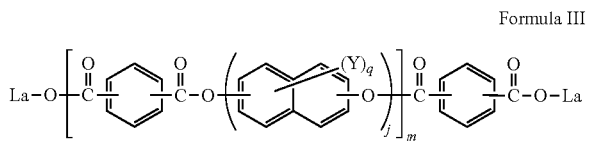

Formula III wherein La is a phenyl group or a naphthyl group; Y in (Y)q is selected from a methyl group and an ester group; q is 1, 2 or 3; j is an integer of 1-10; m is an integer of 1-10.

2. The thermosetting resin composition claimed in claim 1, wherein the thermosetting resin composition further comprises a phosphorous-containing flame retardant.

3. The thermosetting resin composition claimed in claim 2, wherein the phosphorus-containing flame retardant is any one or more selected from the group consisting of tris(2,6-dimethylphenyl)phosphine, 10-(2,5-dihydroxyphenyl)-9,10-dihydro-9-oxa-10-pho sphinophenanthrene-10-oxide, 2,6-bis(2,6-dimethylphenyl)-phosphinobenzene, 10-phenyl-9,10-dihydro-9-oxa-10-phosphinophenanthrene-10-oxide and phosphazene.

4. The thermosetting resin composition claimed in claim 1, wherein the thermosetting resin composition comprises, in parts by weight, the following components:
   the bismaleimide resin 15-50 parts by weight;
   the benzoxazine resin 15-30 parts by weight;
   the epoxy resin 15-30 parts by weight;
   the active ester 2-20 parts by weight;
   a phosphorous-containing flame retardant 0-10 parts by weight.

5. The thermosetting resin composition claimed in claim 1, wherein the benzoxazine resin is an allyl-containing benzoxazine resin.

6. The thermosetting resin composition claimed in claim 1, wherein the epoxy resin is a halogen-free and phosphorus-free epoxy resin, which is any one selected from a biphenyl epoxy resin, a naphthol epoxy resin, a phenolic epoxy resin, a dicyclopentadiene epoxy resin, an aralkyl epoxy resin, a multifunctional epoxy resin, and a mixture of at least two selected therefrom.

7. The thermosetting resin composition claimed in claim 1, wherein the thermosetting resin composition further comprises 0.01-1 part by weight of a curing accelerator.

8. The thermosetting resin composition claimed in claim 7, wherein the curing accelerator is any one or more selected from the group consisting of an imidazole, 4-dimethylaminopyridine, triphenylphosphine, boron trifluoride monoethylamine and zinc octoate.

9. The thermosetting resin composition claimed in claim 1, wherein the thermosetting resin composition further comprises 5 to 300 parts by weight of a filler.

10. The thermosetting resin composition claimed in claim 9, wherein the median particle size of the filler is 0.01-50 μm.

11. The thermosetting resin composition claimed in claim 9, wherein the filler is selected from an organic filler and an inorganic filler.

12. The thermosetting resin composition claimed in claim 11, wherein the inorganic filler is any one or more selected from the group consisting of a non-metal oxide, a metal nitride, a non-metal nitride, an inorganic hydrate and an inorganic salt; and
   wherein the organic filler is any one or more selected from the group consisting of polytetrafluoroethylene, polyphenylene sulfide and polyethersulfone.

13. The thermosetting resin composition claimed in claim 11, wherein the inorganic filler is a surface-treated inorganic filler;
   a surface treatment agent for surface treatment is any one or more selected from the group consisting of a silane coupling agent, an organo silicon oligomer and a titanate coupling agent.

14. The thermosetting resin composition claimed in claim 11, wherein the inorganic filler is any one or more selected from the group consisting of fused silica, crystalline silica, spherical silica, hollow silica, aluminum hydroxide, aluminum oxide, talc, aluminum nitride, boron nitride, silicon carbide, barium sulfate, barium titanate, strontium titanate, boehmite, calcium carbonate, calcium silicate and mica.

15. A prepreg comprising a reinforcing material and the thermosetting resin composition claimed in claim 1 attached to the reinforcing material after impregnation and drying.

16. A metal foil-clad laminate comprising one or at least two laminated prepregs claimed in claim 15 and metal foil covered on one or both sides of the outer side of the prepregs.

17. A printed circuit board comprising at least one prepreg as claimed in claim 15.

* * * * *